(12) United States Patent
Mearini et al.

(10) Patent No.: US 6,521,149 B1
(45) Date of Patent: Feb. 18, 2003

(54) SOLID CHEMICAL VAPOR DEPOSITION DIAMOND MICROCHANNEL PLATE

(76) Inventors: Gerald T. Mearini, 15810 Van Aken Blvd., #302, Shaker Heights, OH (US) 44120; Laszlo A. Takacs, 15700 Van Aken Blvd., #23, Shaker Heights, OH (US) 44120

( * ) Notice: Subject to any disclaimer, the term of this patent is extended or adjusted under 35 U.S.C. 154(b) by 156 days.

(21) Appl. No.: 09/588,457

(22) Filed: Jun. 6, 2000

(51) Int. Cl.⁷ .............................. B44C 1/22; B29D 11/00
(52) U.S. Cl. ............................ 264/81; 216/24; 216/33
(58) Field of Search .......................... 264/81, 232, 340; 216/24, 33; 438/20, 702

(56) References Cited

U.S. PATENT DOCUMENTS

| | | | |
|---|---|---|---|
| 4,563,250 A | * | 1/1986 | Becker et al. |
| 5,265,327 A | | 11/1993 | Faris et al. |
| 5,569,355 A | * | 10/1996 | Then et al. ................ 216/24 |
| 5,997,713 A | * | 12/1999 | Beetz, Jr. et al. |
| 6,187,412 B1 | * | 2/2001 | Armacost et al. |

* cited by examiner

Primary Examiner—Mathieu D. Vargot
(74) Attorney, Agent, or Firm—Fay, Sharpe, Fagan, Minnich & McKee, LLP

(57) ABSTRACT

A method for manufacturing a free-standing solid diamond microchannel plate produces a base structure, including a silicon material, having a backing and a vertical extension. A chemical vapor deposition diamond material is deposited onto the backing. The diamond material is leveled with the vertical extension of the base structure. The silicon backing is removed from the leveled base structure.

10 Claims, 4 Drawing Sheets

Fig. 1 (Prior Art)
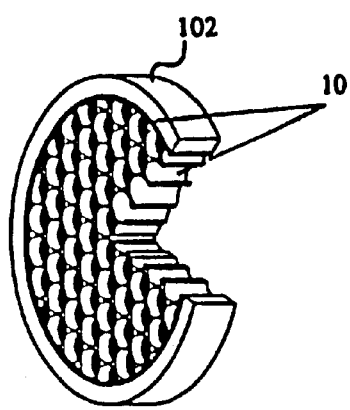
Fig. 2 (Prior Art)
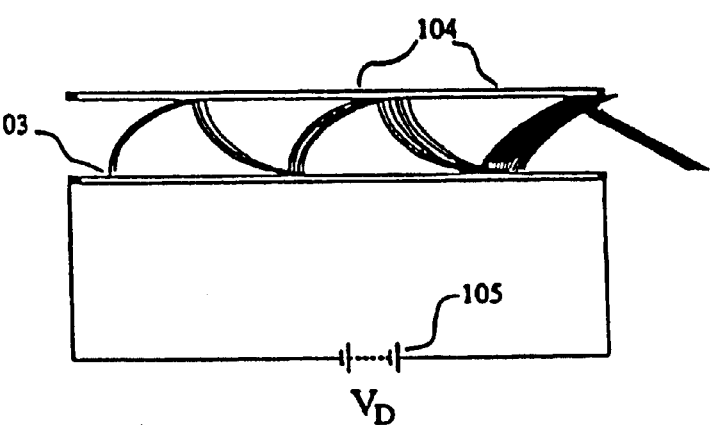
Fig. 3 (Prior Art)
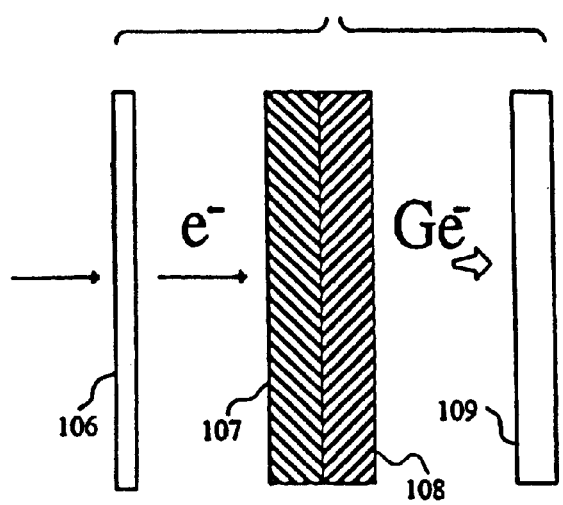
Fig. 4 (Prior Art)
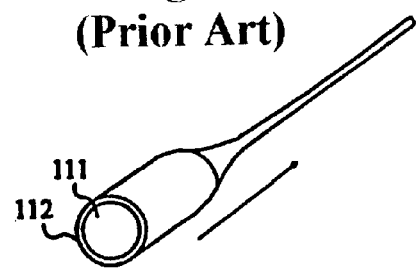
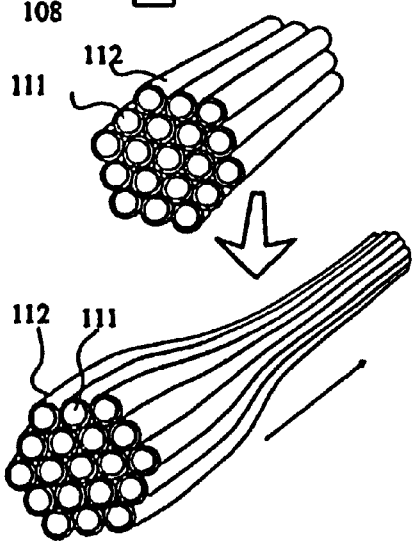
Fig. 5 (Prior Art)

SOLID CHEMICAL VAPOR DEPOSITION DIAMOND MICROCHANNEL PLATE

BACKGROUND OF THE INVENTION

The present invention relates to microchannel plate (MCP) technology. It finds particular application in conjunction with microchannel plates constructed of solid diamond grown using a chemical vapor deposition (CVD) process and will be described with particular reference thereto. It will be appreciated, however, that the invention is also amenable to other like applications.

Microchannel plates are the electron producing section of photomultiplier tubes ("PMT") used for night vision devices and general infrared ("IR") detection equipment. Light enters the PMT through a photocathode, which converts the light signal into a very weak electronic signal. The electronic signal is amplified using an electron multiplier, which operates based on secondary electron emission. Secondary electron emission is the electronic property by which secondary electrons are produced as a result of primary electrons impinging on the material surface. Secondary electron coefficients (i.e., the ratio of secondary electrons produced from a single primary electron) range from two to four in most materials used for PMT applications, and as high as 25 for some exotic materials used for specialized PMT applications.

It is well known that chemical vapor deposition ("CVD") diamond, doped with specific impurities, is electrically conductive and produces copious amounts of secondary electrons. A cesiated diamond surface will produce more than 40 electrons at 1000 eV primary electron energy. Since 40 electrons are produced from each collision, and the process is multiplicative, a diamond MCP can produce millions of times more electrons than state-of-the-art MCPs. CVD Diamond growth processes, however, would likely be unable to coat prefabricated MCP structures since the "pores" or microchannels are typically about 6 $\mu$m in diameter and about 360 $\mu$m deep. Diamond deposition processes require background pressures, which would likely prevent source gasses from filling these pores.

A microchannel plate may be used as a secondary electron multiplier. Typically, the MCP consists of millions of glass microchannels in the form of capillary tubes, which are assembled and fused together to form a two-dimensional array in the shape of a disk. The capillary tubes are formed by drawing down glass-filled, glass-jacketed rods, arid then etching out the glass filling. Typical microchannel diameters range from about 40 $\mu$m to about 10 $\mu$m, with the corresponding channel pitch being such that the channel cross-sectional areas constitute about 50% of the total MCP face area. Metal films, deposited on both faces of the disk, serve as electrodes for applying an electric field across each channel and also electrically connect the multitude of channels together in parallel. Each channel behaves as a sort of continuous-dynode electron multiplier. The input end of an MCP-based detector includes a suitable photocathode optimized for the spectral characteristics of the incident radiation. The photocathode receives the incident photons and generates the primary photoelectrons, which then enter the glass capillary channels. The capillary material is specially chosen (the most common being a lead-oxide glass) such that when electrons impinge on the channel walls, secondary electrons are generated. These secondary electrons are accelerated by the voltage applied across the electrodes and travel in a parabolic trajectory along the length of the channels, until, due to the transverse component of their motion, they collide with the channel walls and dislodge additional secondary electrons with each impact, thus producing electron multiplication, or gain.

Detection of low-level signals—optical (infrared, visible, ultraviolet and X-ray) as well as particle (electrons and ions)—is a critical requirement in a wide variety of applications, both military and civilian. A good example of devices whose performance de pends on their ability to amplify very low-level input signals with large gain ($\geq 10^4$) are night vision systems, which constitute an important part of the increasingly complex and technologically-intensive equipment employed in modem warfare. Currently available high-gain detectors include numerous types of photomultiplier tubes (PMTs) and image-intensifier tubes (IITs), many of which incorporate microchannel plates as the primary amplifying device.

Microchannel plates are almost always geometrically designed so that the channel axes are at a small angle ("bias angle") to the perpendicular of the input and output faces.

Conventional MCP Manufacturing Technology

One process used in the industry for manufacturing microchannel plates is primarily based on the technology of drawing glass fibers and fiber bundles. The fabrication process begins with tubes of a specially formulated glass, usually a lead-oxide composition, that is optimized for secondary-electron emission characteristics. In the tubes are inserted soleid cores of a different glass with differential chemical etching characteristics. The filled tube is softened and drawn to form a monofiber. Millions of such fibers are now stacked together in a bundle in a hexagonal-close-packed format. The bundle is fused together at a temperature of about 500° C. to 800° C. and again drawn until the solid core diameters become approximately equal to the required channel diameter, which ranges from about 40 $\mu$m down to <10 $\mu$m. Now individual microchannel plates are cut from this billet by slicing at the appropriate bias angle to the billet axis. The thickness of the slices is generally such that the channels have a length-to-diameter ratio of about 40–80.

The individual plates are ground and polished to an optical finish. The solid cores are removed by chemical etching in an etchant that does not attack the lead-oxide glass walls, thus producing the hollow channels. Further processing steps lead to the formation of a thin, slightly conductive layer beneath the electron-emissive surface of the channel walls. Electrodes, in the form of thin metal films, are then deposited on both faces of the finished wafer. Finally, a thin membrane of $SiO_2$ (formed on a substrate which is subsequently removed) is deposited on the input face to serve as an ion barrier film, and the plate is secured in one of several different types of flanges. The finished MCP may now be incorporated in various image-intensifying detection systems.

DETAILED DESCRIPTION OF THE PRIOR ART

For best understanding of the microchannel plate, it is best to review in detail the manufacturing process for conventional MCPs. FIGS. 1–3 illustrate the prior art MCP. FIGS. 4 and 5 show the conventional MCP production process of drawing and etching.

FIG. 1 shows an MCP. Microchannels 101 are held in a flange 102. Electrodes and connections, plus ion-barrier film and other items necessary for operation, are not shown. The function of the MCP is to augment the strength of the optical signal input without distortion.

FIG. 2 shows how electron amplification takes place. An electron 103 arrives from the left-to-right direction, and enters the microchannel tube 104. A voltage $V_D$ from a voltage source 105 supplies the high voltage necessary for the electron acceleration. Each electron, whether introduced as the electron 103 or generated within the tube 104, may dislodge one or more other electrons, which may proliferate to hundreds, or even hundreds of thousands, of electrons.

FIG. 3 shows how a photon striking electrode 106 dislodges an electron (e⁻), which passes through chevron configuration microchannel plates 107, 108 with electron amplification and emerges as a great number of electrons (Ge⁻), which strike a phosphor layer 109 and result in phosphorescent light output P.

FIG. 4 shows how a tiny glass-clad glass rod is drawn down to a capillary size, essentially by heating it to a softened state and then pulling. This leaves an inner glass 111 still clad in an outer glass 112, with both drawn down to a miniature capillary size. Additional steps are required to remove a glass core 111 to leave the hollow glass tube 112, drawn down to the microchannel size.

FIG. 5 shows how the glass-clad glass cores 111, 112 are bundled and drawn down in bundles to capillary size.

FIG. 6 shows how the drawn bundles of glass tubes are fused to form tubes 113 (which are still filled with glass) with fused walls 114. These bundles are placed at a small angle to the cutting saw and are sliced at places such as slice site 115 to provide microchannel blanks.

FIG. 7 shows schematically how a microchannel slice 115 has channels 116 at a slight angle to the perpendicular of the slice face. The microchannels 116 may be etched out with a suitable etchant, which attacks the core glass much more quickly than it might attack the cladding glass, leaving the tubes hollow.

FIG. 8 shows how the myriad of microchannels 116 are fused together and held in a flange 117.

FIG. 9 shows how ion-barrier film 118 and electrodes 119 are placed over the ends of the microchannels which are held together in a flange 117. Electrodes 119 are connected to a suitable voltage source. These electrodes are indium tin oxide or other transparent conductor. The ion-barrier film 118 may be $SiO_2$.

The present invention provides a new and improved apparatus and method which overcomes the above-referenced problems and others.

SUMMARY OF THE INVENTION

A method for manufacturing a free-standing solid diamond microchannel plate produces a base structure, including a silicon material, having a backing and a vertical extension. A chemical vapor deposition diamond material is deposited onto the backing. The diamond material is substantially leveled with the vertical extension of the base structure. The silicon backing is removed from the leveled base structure.

In accordance with one aspect of the invention, the backing is removed by immersing the leveled structure into a solution including KOH.

In accordance with a more limited aspect of the invention, the base structure is produced so that at least one of the backing and the vertical extension include the silicon material.

In accordance with a more limited aspect of the invention, the vertical extensions are produced to have a diameter of about 6 μm and a height of about 360 μm.

In accordance with a more limited aspect of the invention, the diamond is deposited on the backing by filling a cavity, formed on the base structure by the vertical extensions, with the chemical vapor deposition diamond material.

In accordance with an even more limited aspect of the invention, the diamond material is leveled by machining excess diamond extending above the vertical extensions.

In accordance with an even more limited aspect of the invention, the chemical vapor deposition diamond material is polished to be substantially level with a top of the vertical extensions.

In accordance with another aspect of the invention, the chemical vapor deposition diamond material is polished with a laser machining process.

In accordance with another aspect of the invention, the base structure is produced by microfabricating the base structure using a deep reactive ion etch.

One advantage of the present invention is that a secondary electron coefficient greater than about 40 is achieved.

Another advantage of the present invention is that a significantly improved efficiency and output of night vision devices is achieved.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 1 illustrates a prior art representation of a microchannel plate;

FIG. 2 illustrates diagrammatically how a single primary electron is augmented by additional secondary electrons which it generates as it travels through the microchannel which acts as an electron multiplier, in prior art;

FIG. 3 illustrates a prior art representation of a chevron microchannel plate optical amplifier, implemented in MCP technology;

FIG. 4 illustrates how a glass-coated glass rod is drawn down to a fiber, in prior art;

FIG. 5 illustrates a composite drawing showing in semidiagrammatic fashion how in prior art the glass-coated glass fibers are further drawn down to microscopic sizes in a fused bundle;

DETAILED DESCRIPTION OF THE PREFERRED EMBODIMENTS

Figure 6:
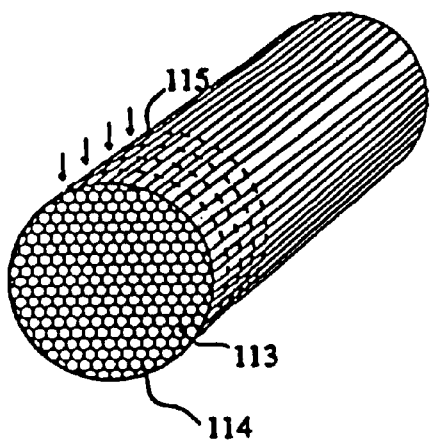
FIG. 6 illustrates how a solidified bundle of microchannels is sliced into individual microchannel plates, in MCP technology as in prior art.
Figure 7:
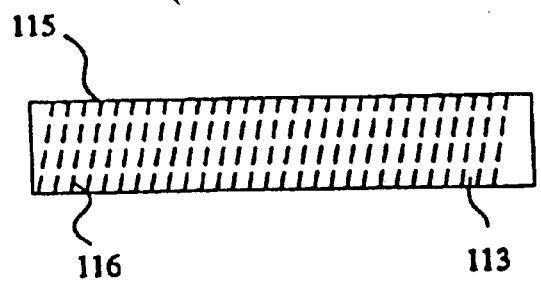
FIG. 7 illustrates diagrammatically how the individual channels are mechanically biased at an angle to the expected path of incident light, in this invention or in prior art.
Figure 9:
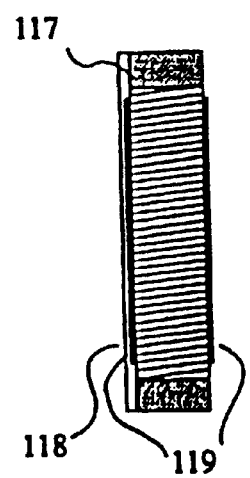
FIG. 9 illustrates a side view of the MCP of FIG. 8, with electrodes attached.
Figure 8:
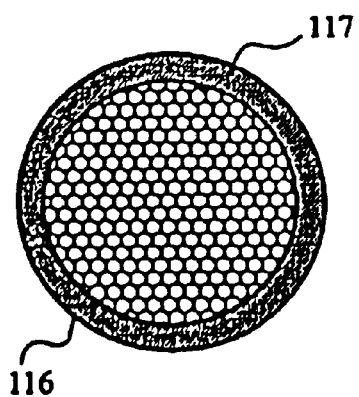
FIG. 8 illustrates a greatly enlarged semidiagrammatic showing of the MCP with its mounting flange, in prior art.
Figure 10:
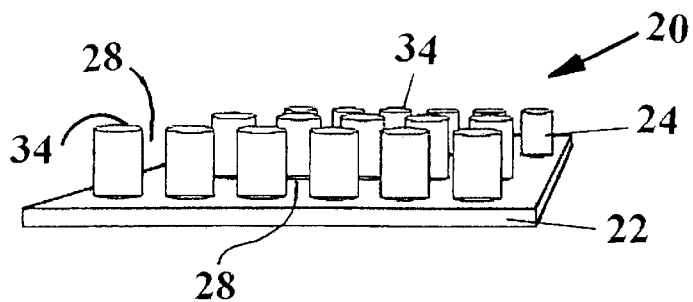
FIG. 10 illustrates a first step in fabricating the diamond microchannel plate of the present invention.
Figure 11:
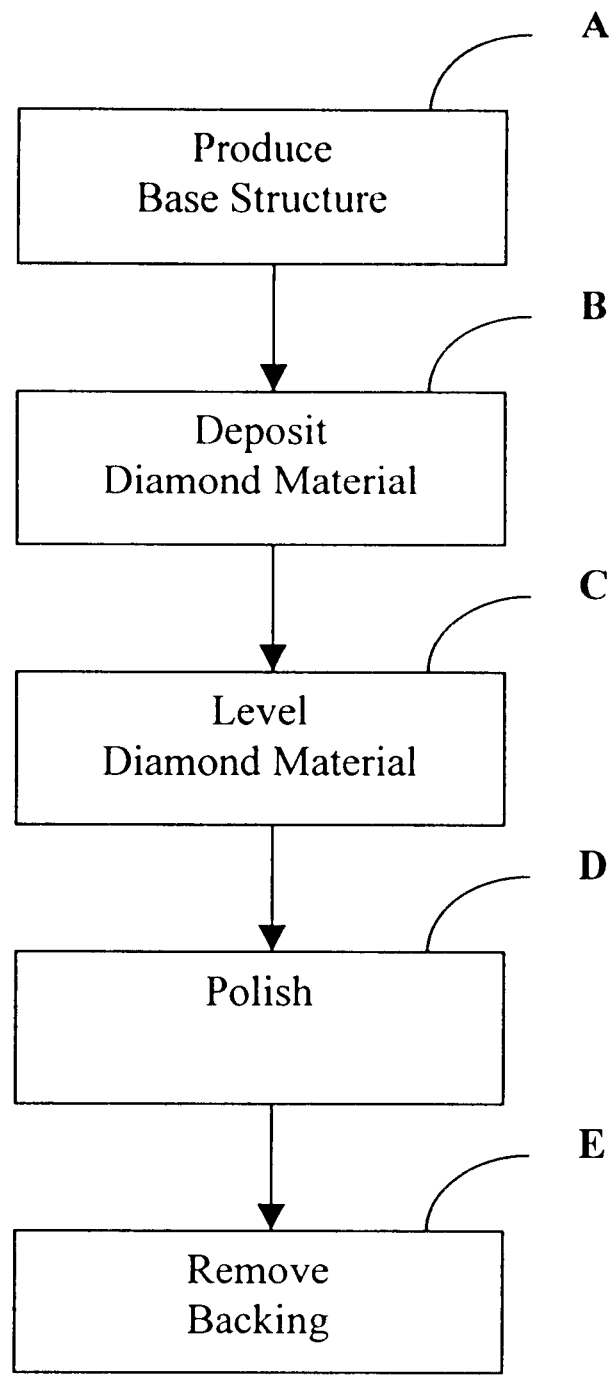
FIG. 11 illustrates a flowchart of a process for fabricating the diamond microchannel plate of the present invention.

With reference to FIGS. 10 and 11, a base structure 20, preferably including a silicon material, is produced in a step A. The base structure 20 is preferably cut and polished to achieve a crystal orientation between about 3° and about 5° from a normal to a surface of the structure 20. Such a crystal orientation makes it possible to add a bias angle during fabrication.

A backing 22 and vertical extensions 24, or posts, included on the base structure 20, are formed during the producing step A. The vertical extensions 24 are preferably formed in the producing step A to have a diameter of about 6 μm and a height of about 360 μm. Furthermore, the base structure 20 is preferably produced using a deep relative ion etch (RIE) or similar microfabrication process.

Figure 12:
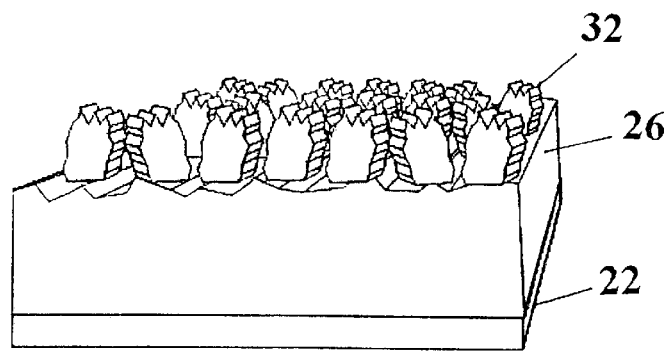
FIG. 12 illustrates a second step in fabricating the diamond microchannel plate of the present invention.

In the preferred embodiment, both the backing 22 and the vertical extensions 24 include the silicon material. With reference to FIGS. 10–12, a chemical vapor deposition diamond material 26 is deposited (filled) into cavities 28, which are formed by the vertical extensions 24 on the backing 22, in a step B. The depositing step B typically produces unwanted excess diamond growth 32 above top portions 34 of the posts 24.

Figure 13:
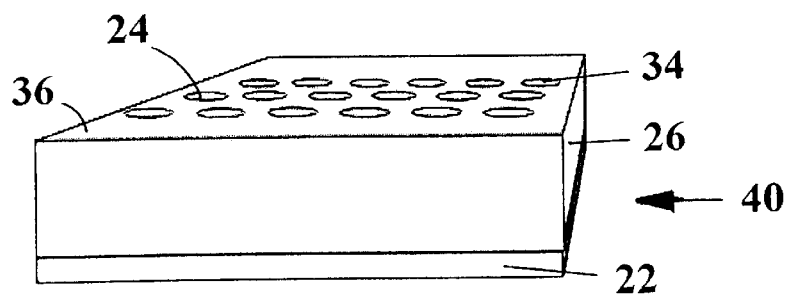
FIG. 13 illustrates a third step in fabricating the diamond microchannel plate of the present invention.

With reference to FIGS. 11–13, the diamond material 26 is substantially leveled with top portions 34 of the vertical extensions 24 of the base structure in a step C. In this manner, the excess diamond growth 32 above the top portions 34 of the posts 24 is eliminated, thereby leaving a smooth and leveled diamond top surface 36 on a leveled structure 40.

Optionally, the top surface 36 of the diamond material 26 is polished using a cast iron polishing wheel in a step D.

The backing 22 is removed in a step E. Preferably, the backing 22 is removed by immersing the leveled structure 40 into a solution including KOH (e.g., 10% KOH) for removing the silicon while leaving the diamond 26 unaffected.

It is contemplated in the preferred embodiment, that the leveling step C machines excess diamond material 26, which extends above the vertical extensions 24, using a laser process.

Figure 14:
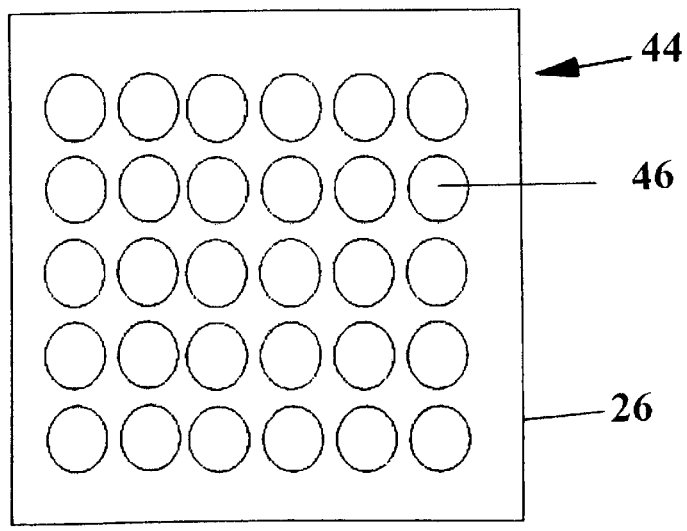
FIG. 14 illustrates the final diamond microchannel plate of the present invention.

FIG. 14 illustrates a free-standing, solid diamond microchannel plate (MCP) 44 with channels 46 in the diamond material 26, which results from the process described above.

The steps A–E describe using microfabrication processes to fabricate a "negative" of the MCP 44 from a silicon wafer. Hot filament chemical vapor deposition "fills" the silicon base structure with diamond. The diamond, which has a polished surface, is preferably doped to achieve the necessary conductivity. The free-standing solid diamond MCP 44 has electron multiplication capabilities millions of times greater than current state-of-the-art technology.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method for manufacturing a free-standing solid diamond microchannel plate, comprising:

producing a base structure, including a silicon material, having a backing and a plurality of vertical extensions;

depositing a chemical vapor deposition diamond material onto the backing;

substantially leveling the diamond material with the vertical extension of the base structure; and removing the silicon backing and vertical extensions from the leveled diamond material.

2. A method for manufacturing a free-standing solid diamond microchannel plate comprising:

producing a base structure, including a silicon material, having a backing and a plurality of vertical extensions;

depositing a chemical vapor deposition diamond material onto the backing;

substantially leveling the diamond material with the vertical extension of the base structure; and immersing the leveled diamond material into a solution including KOH, thereby removing the silicon backing and vertical extensions from the leveled diamond material.

3. The method for manufacturing a free-standing solid diamond microchannel plate as set forth in claim 2, wherein the producing step includes:

producing at least one of the backing and the vertical extensions to include the silicon material.

4. The method for manufacturing a free-standing solid diamond microchannel plate as set forth in claim 3, wherein the producing step includes:

producing the vertical extensions to have a diameter of about 6 μm and a height of about 360 μm.

5. The method for manufacturing a free-standing solid diamond microchannel plate as set forth in claim 4, wherein the depositing step includes:

filling a cavity, formed on the base structure by the vertical extensions, with the chemical vapor deposition diamond material.

6. The method for manufacturing a free-standing solid diamond microchannel plate as set forth in claim 5, wherein the leveling step includes:

machining excess diamond extending above the vertical extensions.

7. The method for manufacturing a free-standing solid diamond microchannel plate as set forth in claim 6, further including:

polishing the chemical vapor deposition diamond material substantially level with a top of the vertical extensions.

8. The method for manufacturing a free-standing solid diamond microchannel plate as set forth in claim 1, wherein the polishing step includes:

polishing the chemical vapor deposition diamond material with a laser machining process.

9. The method for manufacturing a free-standing solid diamond microchannel plate as set forth in claim 1, wherein the producing step includes:

microfabricating the base structure using a deep reactive ion etch.

10. The method for manufacturing a free-standing solid diamond microchannel plate as set forth in claim 1, wherein the producing step includes:

cutting the base structure to achieve a crystal orientation between about 3° and about 5° from a normal to a surface of the base structure.

* * * * *